(12) United States Patent
Voshell

(10) Patent No.: US 7,263,017 B2
(45) Date of Patent: *Aug. 28, 2007

(54) AC SENSING FOR A RESISTIVE MEMORY

(75) Inventor: Thomas W. Voshell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/481,957

(22) Filed: Jul. 7, 2006

(65) Prior Publication Data

US 2006/0250872 A1 Nov. 9, 2006

Related U.S. Application Data

(63) Continuation of application No. 10/681,161, filed on Oct. 9, 2003, now Pat. No. 7,123,530.

(51) Int. Cl.
*G11C 7/02* (2006.01)
(52) U.S. Cl. ............... 365/207; 365/148; 365/189.07
(58) Field of Classification Search .............. 365/207, 365/148, 189.07
See application file for complete search history.

(56) References Cited

U.S. PATENT DOCUMENTS

| 5,724,297 | A | * | 3/1998 | Noda et al. ............... 365/226 |
| 5,881,007 | A | | 3/1999 | Jeong et al. |
| 6,226,222 | B1 | | 5/2001 | Park |
| 6,278,631 | B1 | | 8/2001 | Naji |
| 6,462,998 | B1 | * | 10/2002 | Proebsting ............... 365/205 |
| 7,123,530 | B2 | * | 10/2006 | Voshell ..................... 365/207 |
| 2002/0008987 | A1 | | 1/2002 | Hideaki et al. |

* cited by examiner

*Primary Examiner*—Tuan T. Nguyen
(74) *Attorney, Agent, or Firm*—Dickstein Shapiro LLP

(57) ABSTRACT

Alternating current is used to sense a logic state of a memory cell that has a resistive memory element. The memory element can be in an array and a memory device can include the array and peripheral circuitry for reading or sensing each memory cell in the array. The peripheral circuitry can include a clock/control circuit providing a control signal, which controls when a row of memory cells are sensed, a switching circuit for receiving a cellplate count signal and a bit count signal provided by the clock/control circuit, a cellplate line signal and a bit line signal from the memory cell, the switching circuit producing a first output signal and a second output signal, wherein one of the first output signal and the second output signal is at a supply voltage and the other of the first output signal and the second output signal alternates polarity with each sensing operation and a comparison circuit receiving the first output signal and the second output signal and outputting a signal corresponding to the logic sate of the memory cell.

10 Claims, 5 Drawing Sheets

AC SENSING FOR A RESISTIVE MEMORY

This application is a continuation application of U.S. patent application Ser. No. 10/681,161, filed Oct. 9, 2003, now U.S. Pat. No. 7,123,530, issued on Oct. 17, 2006, the entirety of which is incorporated herein by reference.

FIELD OF THE INVENTION

The present invention relates to resistive memory devices and, more particularly, to read/sense circuitry for resistive memory devices.

BACKGROUND OF THE INVENTION

Integrated circuit designers have always sought the ideal semiconductor memory—a device that is randomly accessible, can be written and read very quickly, is non-volatile, but indefinitely alterable, and consumes little power. Resistive memories, including programmable contact random access memory (PCRAM) technology has been increasingly viewed as offering all these advantages.

Digital memories are widely used in computers, computer system components and computer processing systems. Resistive memories store digital information in the form of bits or binary digits as "0"s or "1"s based on the resistance of a memory element or cell. Resistive memory devices are configured in arrays where a resistive element or cell is at the intersection of a row line (word line) and a column line (digit line or bit line). In order to read or sense the state of a memory cell, it is necessary to first select the desired memory cell by selecting the column line and row line, which intersect at the desired memory element. Once the desired memory element is isolated, the selected memory cell is then read by applying a read voltage to the cell to detect the resistance of the memory cell and thereby, determine the logic state of the memory cell.

For binary logic state sensing, the absolute magnitude of memory cell resistance need not be known, only whether the resistance of a memory cell is above or below a threshold value that is between logic one and logic zero resistance values. Nonetheless, sensing the logic state of a PCRAM memory element is difficult because the technology of the PCRAM device imposes multiple constraints.

BRIEF SUMMARY OF THE INVENTION

The present invention provides embodiments in which the state of a resistive memory element is read using an alternating current (AC). Reading the state of a resistive memory element with AC avoids over-programming or erasing the memory element.

BRIEF DESCRIPTION OF THE DRAWINGS

These and other features and advantages of the invention will be more clearly understood from the following detailed description, which is provided in connection with the accompanying drawings, in which.

DETAILED DESCRIPTION OF THE INVENTION

Memory bits based on changes in the resistance of materials in response to a programming (writing or erasing) voltage or current hold a great deal of promise for non-volatile memories. Some of these resistive memory bits (mbits) exhibit changes in viability if read repeatedly due to a small current being applied repeatedly to sense/read the device. As it loses viability, the memory bit is not so easily programmed or erased and may even remain in a logic state.

Resistive memory bits can be modeled as resistors. In a conventional direct current (DC) reading/sensing circuit, a current is applied to the memory bit and a voltage is measured or a voltage is applied to the memory bit and a current is measured.

Figure 1:
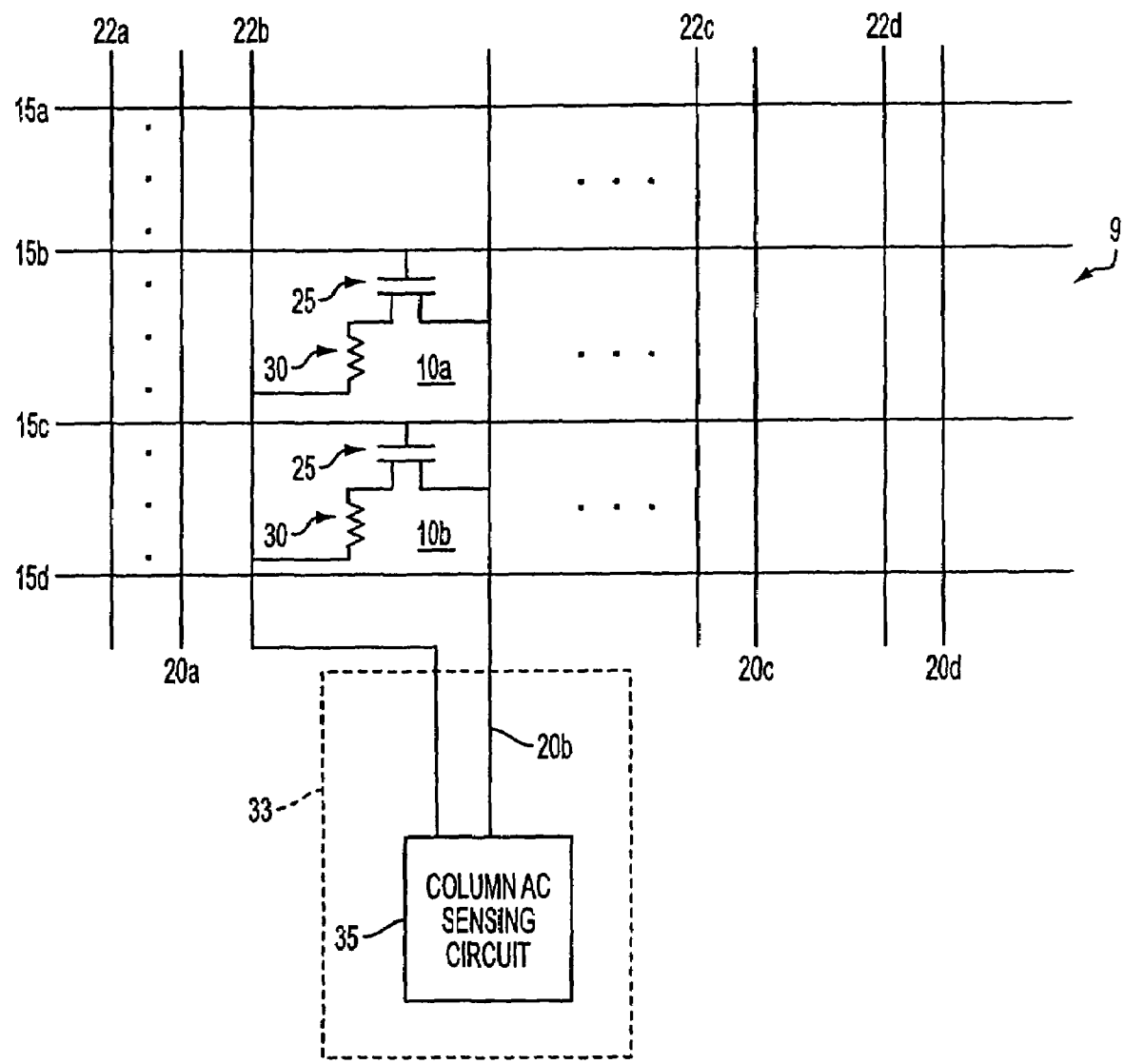
FIG. 1 shows a portion of a programmable contact random access memory (PCRAM) device.

FIG. 1 shows a portion of a PCRAM device including an array 9 of resistive memory cells (memory bits) arranged at the intersection of column lines (bit lines/digit lines) 20a-20d and row lines (word lines) 15a-15d. In addition, array 9 includes cellplate lines 22a, 22b, 22c and 22d paired respectively with bit lines 20a, 20b, 20c and 20d.

Two exemplary memory cells 10a and 10b are shown. Memory cell 10a is addressed by row line 15b and digit 20b and cellplate line 22b. Memory cell 10b is addressed by row line 15c and line 20b. Memory cells 10a and 10b each include an access transistor 25 and a programmable resistance element 30 connected in series between bit line 20b and cellplate line 22b. Bit line 20b and cellplate line 22b are similarly connected to all cells in the same column of array 9. In the following discussion, the exemplary embodiments of the present invention are described with reference to exemplary memory cell 10a.

Figure 2A:
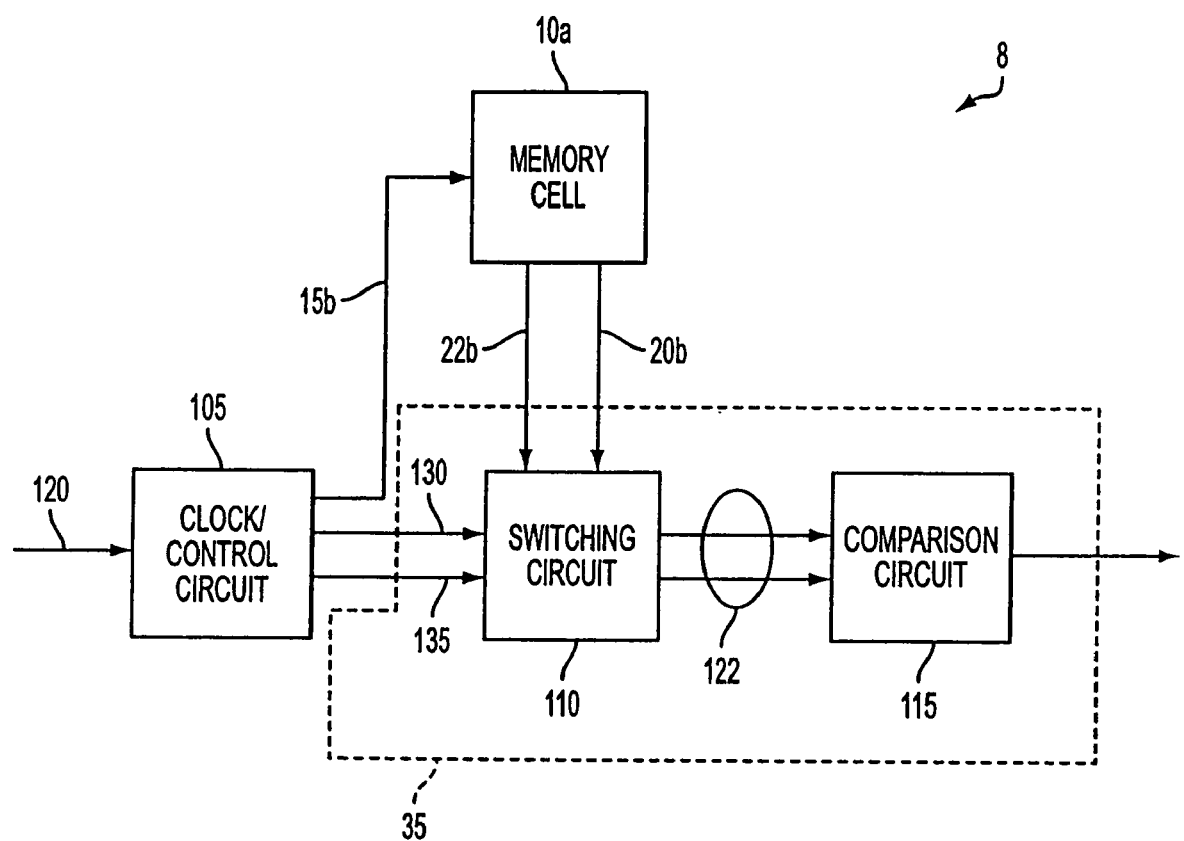
FIG. 2A shows an AC sensing circuit and other components of the PCRAM device of FIG. 1 in simplified block diagram form.
Figure 2B:
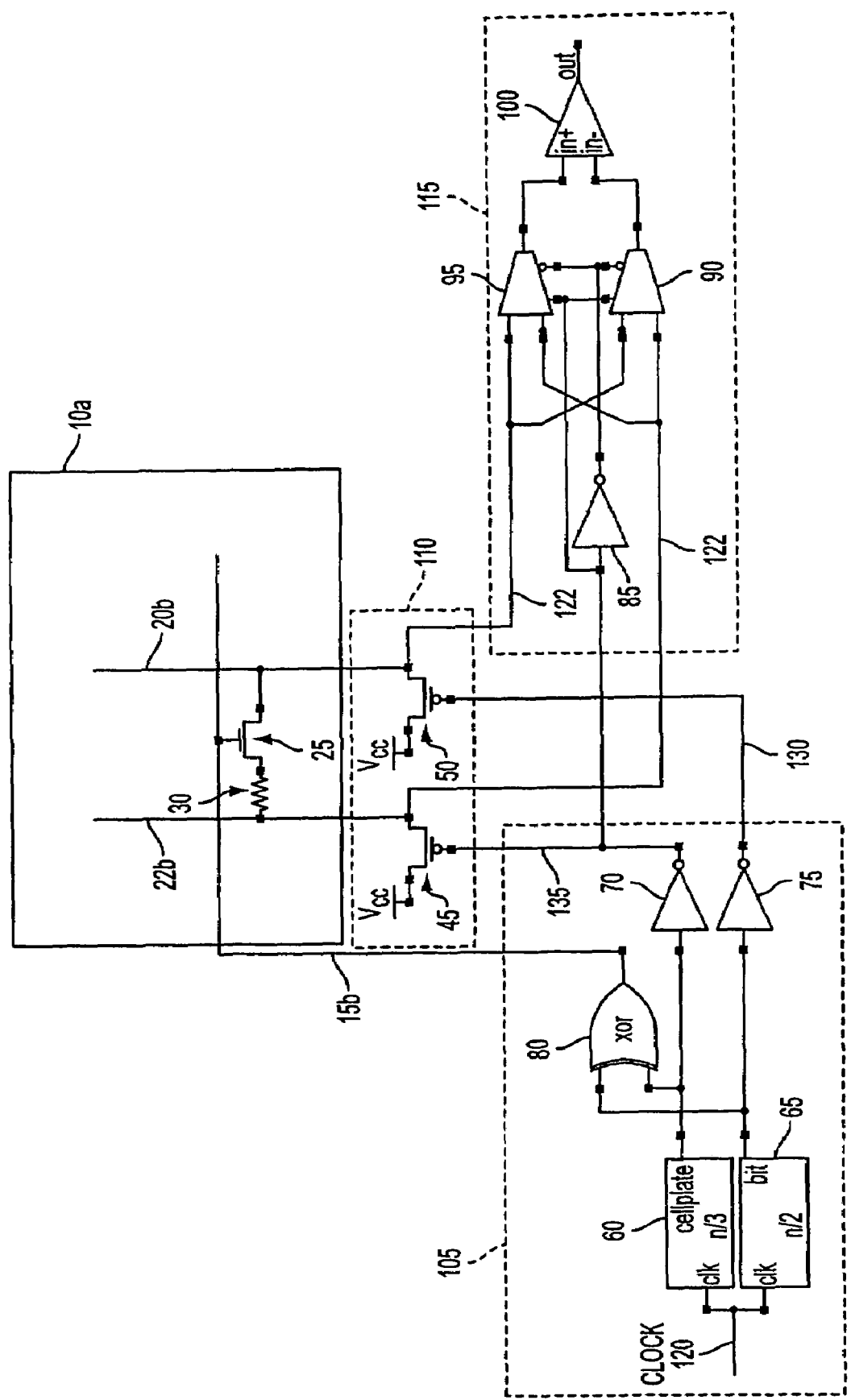
FIG. 2B is a schematic circuit diagram showing components of FIG. 2A in grater detail.

In accordance with an exemplary embodiment the present invention, bit lines 20a, 20b, 20c and 20d are each connected to a respective AC sensing circuit 35 and may be implemented as shown in FIGS. 2A and 2B or with other appropriate components. Array 9 and the peripheral circuitry could all be integrated in a single integrated circuit, if desired.

FIG. 2A shows an exemplary embodiment of the AC sensing circuit 35 in simplified block diagram form together with other components of memory device 8. AC sensing circuit 35 includes switching circuit 110 and comparison circuit 115. Memory device 8 also includes a clock/control circuit 105 coupled to memory element 10a through word line 15b and further coupled to switching circuit 110. The memory cell 10a is also coupled to the switching circuit 110 through bit line 20b and cellplate line 22b.

The clock/control circuit 105 receives a source clock signal 120 and provides a cellplate count signal 135 and a bit count signal 130 to switching circuit 110. Clock/control circuit 105 also provides a signal on word line 15b.

The signal on word line 15b is received by memory cell 10a and other cells in the same row. The signal on each row's word line functions as a control signal to control when the sensing operation is performed for all cells in the row. A high pulse on a row's word line turns on transistor 25 of each cell, providing a conductive path through resistance element 30.

In response to signals 130 and 135, switching circuit 110 provides two signals to comparison circuit 115 via two signal lines 122. At any point in time at which a comparison is made between the signals, on lines 125, one signal line 122 is at the supply voltage $V_{cc}$ and the other is at a voltage that depends on resistance element 30. The signal through resistance element 30 alternates polarity during a read operation.

FIG. 2B shows more detailed exemplary embodiments of the components shown in FIG. 2A. The illustrated switching circuit 110 includes PMOS transistors 45, 50 controlled by signals 135, 130, respectively. Cellplate line 22b and bit line 20b are each coupled through respective transistors 45, 50 to the supply voltage $V_{cc}$.

The clock/control circuit 105 includes cellplate counter 60, bit counter 65, Exclusive-or (XOR) gate 80 and two inverters 70, 75. A source clock signal is supplied to cellplate counter 60 and bit line counter 65. Cellplate counter 60 provides its output to inverter 70 and XOR gate 80. Bit line counter 65 similarly provides its output to inverter 75 and XOR gate 80. XOR gate 80, in turn, modulates a signal on word line 15b, to control when transistor 25 is turned on. Inverters 70 and 75 provide signals 135 and 130 respectively.

Comparison circuit 115 includes inverter 85, CMOS multiplexers 90, 95 and switched capacitor sensing amplifier 100. Signal 135 from inverter 70 is applied to the gate of transistor 45 and to inverter 85. Signal 135 from inverter 70 is also applied as a control signal to each CMOS multiplexer 90, 95 as is the output of inverter 85. The output from inverter 75 is applied to the gate of transistor 50. When turned on by signal 135 going low, transistor 45 pulls cellplate line 22b to $V_{cc}$; when turned on by signal 130 going low, transistor 50 pulls bit line 20b to $V_{cc}$.

Lines 122 connect bit line 20b and cellplate line 22b to both CMOS multiplexers 90, 95. The CMOS multiplexers 90, 95 can be conventional four transistor multiplexers, each multiplexer having five terminals (two input terminals, two control terminals and one output terminal). The CMOS multiplexers 90, 95 will each select one input from lines 122 as its output based on signal 135 and the output of inverter 75. When signal 135 is low, CMOS multiplexer (MUX) 95 provides the signal from bit line 20b while MUX 90 provides $V_{cc}$ from transistor 45; when signal 135 is high, MUX 90 provides $V_{cc}$ from transistor 50 and MUX 95 provides the signal from cellplate 22b. As a result, MUX 95 always provides a sensed signal from memory cell 10a while MUX 90 always provides $V_{cc}$ as a reference voltage.

The outputs of the CMOS multiplexers 90, 95 are applied to switched capacitor sensing amplifier 100. Switched capacitor sensing amplifier 100 is a current input amplifier that is sensitive to a small amount of positive or negative current at its terminals and compares the current with a threshold. The threshold is set so that the output of the switched capacitor sensing amplifier 100 corresponds to the logic state of a particular memory cell connected to bit line 20b and cellplate line 22b, such as memory cell 10a. There is one switched capacitor sensing amplifier 100 per column or bit line but only one row of cells is read at one time under control of the word lines.

FIGS. 2A and 2B depict a single cell only. A memory device has a plurality of memory elements arranged in rows and columns. The circuit of the present invention is intended to be adapted for a memory device. When adapted for use with a memory device, a single control circuit is used for each column with additional selection logic and access devices (not shown). That is, the XOR gate is an "enabled" XOR gate being enabled by word line decode circuitry. Multiple counters are advantageously stacked in the row direction with one set of counters for each column or one set of counters per chip. Similarly, one comparison circuit per column would be advantageous. The switching circuit would advantageously have additional multiplexers for use with a memory device.

Figure 3:
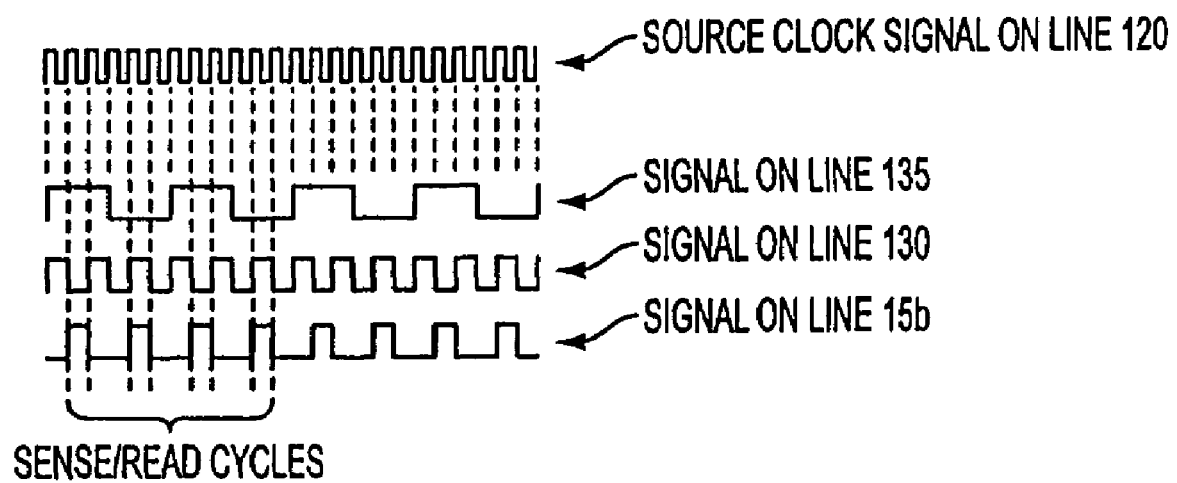
FIG. 3 is a timing diagram for signals provided by the clock/control circuit in FIG. 2B.

FIG. 3 is a timing diagram for signals from circuit 105 in FIG. 2B. Transistor 25 is on when the signal on word line 15b goes high. In the first instance that the word line 15b goes high, cellplate count signal 135 is high and bit count signal 130 is low. In the next instance that the word line 15b goes high, the cellplate count signal 135 is low and bit count signal 130 is high. The read cycles thus alternate in the direction of the current through resistance 30. Comparison circuit 115, however, effectively rectifies the alternating current before switched capacitor sensing amplifier 100 provides the output bit. It should be understood that the relationship between the bit count signal and the cellplate count signal is 6:2 or 3:1 and that there are four clock transitions (rising and falling edges) of the bit count signal 130 for each pair of transitions (rising and falling edge) of the cellplate count signal 135. That is, the cellplate count signal 135 is the (input) clock signal divided by 6 and the bit count signal 130 is the clock signal divided by 2.

XOR gate 80 (FIG. 2B) ensures that the signal on word line signal 15b is high when the cellplate count signal 135 is high and the bit count signal 130 is low or when the cellplate count signal 135 is low and the bit count signal 130 is high. When signal 135 is low and word line 15b is high, current flows from transistor 45 through resistive element 30 and CMOS multiplexer 95 to switched capacitor sensing amplifier 100. When signal 130 is low and word line 15b is high, current flows from transistor 50 through resistive element 30 and CMOS multiplexer 90 to switched capacitor sensing amplifier 100.

Among the advantages of employing AC sensing for resistive memory cells is prolonging the viability of the memory cells of a memory device. Reading the state of a memory element/cell with AC avoids over-programming or partially erasing the memory element.

The present invention has been described using PMOS transistors but may also be implemented using NMOS transistors. The control signals are described as clock signals with which the cellplate line and bit line have a certain relationship one to the other. These control signals may be of any other form or relationship so long as they function as described herein to control memory cells and to gate transistors in the switching circuit. The control circuit, switching circuit and comparison circuits of the present invention may be implemented with individual components moved to another circuit so long as the requisite functionality is implemented. For example, the inverters of the control circuit may be considered part of the switching circuit. The inverters and multiplexers of the comparison circuit may also be considered part of the switching circuit.

Figure 4:
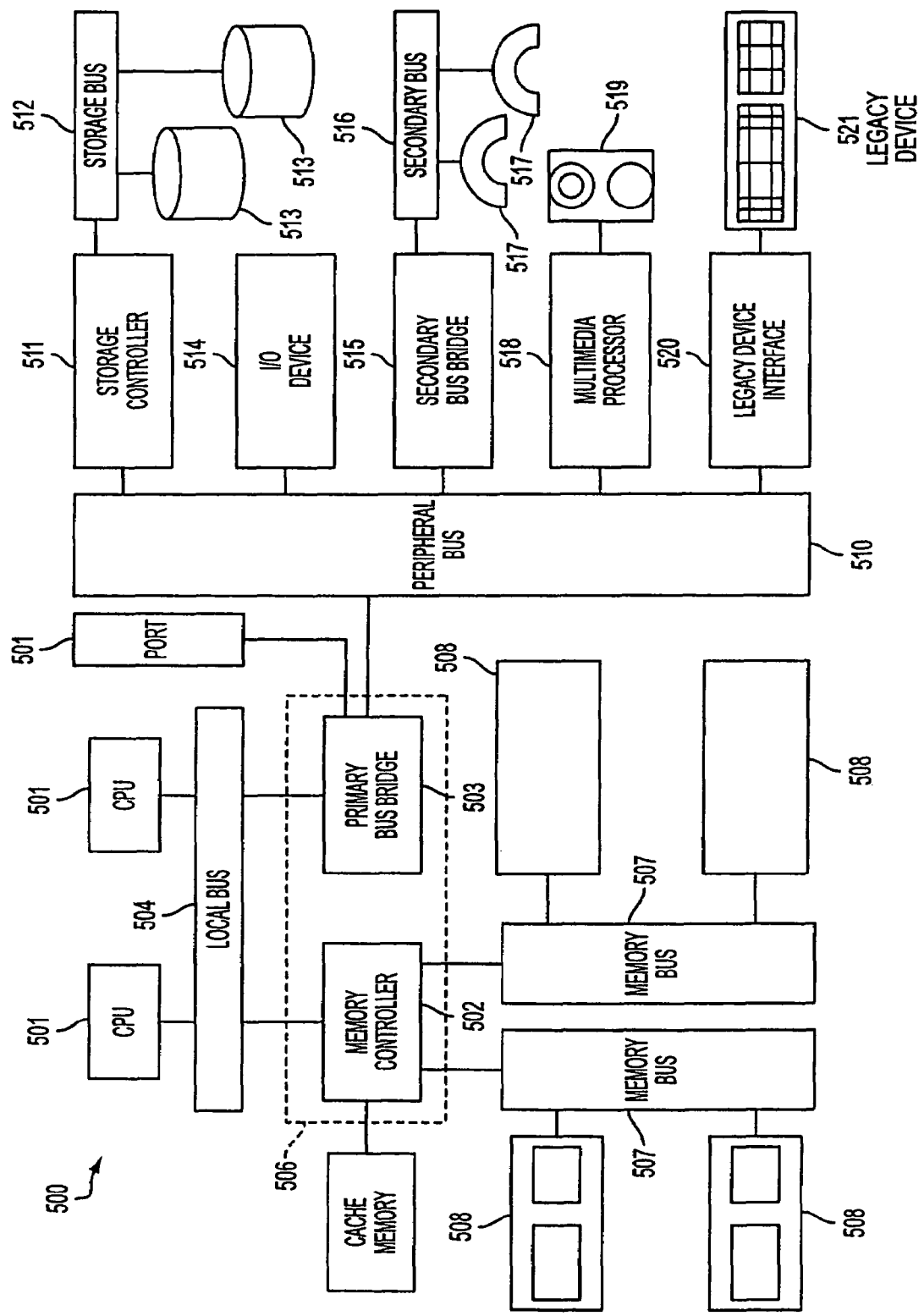
FIG. 4 shows a digital processing system incorporating a memory device according to an exemplary embodiment of the present invention.

FIG. 4 illustrates an exemplary digital processing system 500 which has components 508 utilizing a memory device 8 employing the sensing circuit 35 of the present invention disclosed above in connection with FIGS. 1-3. The processing system 500 includes one or more processors 501 coupled to a local bus 504. A memory controller 502 and a primary bus bridge 503 are also coupled to the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508, which include at least one memory device 8 that includes sensing circuit 35. Each of the memory components 508 may be a memory card or a memory module. Examples of memory modules include single inline memory modules (SIMMs) and dual inline memory modules (DIMMs). The memory components 508 may include one or more additional devices. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be a local area network interface, such as an Ethernet card. The secondary bus bridge may be used to interface additional devices via another bus to the processing system. For example, the secondary bus bridge may be an universal serial port (USB) controller used to couple USB devices 517 via to the processing system 500. The multimedia processor 518 may be a sound card, a video capture card, or any other type of media interface, which may also be coupled to one additional devices such as speakers 519. The legacy device interface 520 is used to couple legacy devices 521, for example, older styled keyboards and mice, to the processing system 500.

The processing system 500 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 500 to become more suitable for use in a variety of applications. For example, many electronic devices that require processing may be implemented using a simpler architecture that relies on a CPU 501 coupled to memory components 508. These electronic devices may include, but are not limited to audio/video processors and recorders, gaming consoles, digital television sets, wired or wireless telephones, navigation devices (including systems based on the global positioning system (GPS) and/or inertial navigation), and digital cameras and/or recorders. The modifications may include, for example, elimination of unnecessary components, addition of specialized devices or circuits, and/or integration of a plurality of devices.

While embodiments of the invention have been described in the illustrations above, it should be understood that these are exemplary of the invention and are not to be considered as limiting. While the present invention has been described in terms of PCRAM, it is not limited thereto but is applicable to, for example, magnetic resistive random access memory (MRAM) PCRAM and other resistive memory circuits in which signals are sensed at different levels. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. An apparatus for sensing a logic state of a memory cell, comprising:
    a control circuit providing a control signal to said memory cell, said control signal controlling when said memory cell is sensed;
    a switching circuit that receives a cellplate count signal and a bit count signal provided by said control circuit, said switching circuit further receiving a cellplate line signal and a bit line signal from said memory cell, said switching circuit producing a first output signal and a second output signal; and
    a comparison circuit receiving said first and second output signals and outputting a signal corresponding to the logic state of said memory cell.

2. The apparatus according to claim 1, wherein said control circuit comprises:
    a cellplate counter that produces said cellplate count signal;
    a digit counter that produces said bit count signal; and
    an exclusive-or (XOR) gate that produces said control signal.

3. The apparatus according to claim 2, wherein said control circuit comprises:
    a first inverter for receiving said celiplate count and producing an inverted celiplate count signal and applying said inverted cellplate count signal to said switching circuit; and
    a second inverter for receiving said bit count signal and producing an inverted bit count signal and applying said inverted bit count signal to said switching circuit.

4. The apparatus according to claim 3, wherein said comparison circuit further comprises:
    a third inverter for receiving said inverted cellplate count signal and producing an inverted signal;
    a first multiplexer for receiving said inverted signal, said inverted cellplate count signal, said first output signal, and said second output signal, said first multiplexer producing a third output signal;
    a second multiplexer for receiving said inverted signal, said inverted cellplate count signal, said first output signal, and said second output signal, said second multiplexer producing a fourth output signal; and
    a switched capacitor sensing amplifier for selecting one of said first output signal and said second output signal, said selected one of said first output signal and said second output signal corresponding to said logic state of said memory cell.

5. The apparatus according to claim 1, wherein said comparison circuit comprises a switched capacitor sensing amplifier for selecting one of said first output signal and said second output signal, said selected one of said first output signal and said second output signal corresponding to the logic state of said memory cell.

6. The apparatus according to claim 1, wherein said switching circuit comprises:
   a first inverter for receiving said cellplate count and producing an inverted celiplate count signal and applying said inverted celiplate count signal to said switching circuit;
   a second inverter for receiving said bit count signal and producing an inverted bit count signal and applying said inverted bit count signal to said switching circuit;
   a third inverter for receiving said inverted celiplate count signal and producing an inverted signal;
   a first multiplexer for receiving said inverted signal, said inverted cellplate count signal, said first output signal, and said second output signal, said first multiplexer producing a third output signal; and
   a second multiplexer for receiving said inverted signal, said inverted cellplate count signal, said first output signal, and said second output signal, said second multiplexer producing a fourth output signal.

7. A memory device comprising:
   an array of memory cells;
   a cellplate line common across said array of memory cells; and
   an apparatus for sensing a logic state of one of said memory cells, said apparatus conlprising:
      first and second sensing lines between which are connected to a memory element having at least two resistive memory states,
      switching circuitry that provides sensing current through the memory element, and
      output circuitry that receives said sensing current and, in response, provides an output signal indicating a resistance state of said memory element.

8. A processing system, comprising:
   a processor; and
   a memory device coupled to said processor via a bus, said memory device comprising:
      an array of memory cells,
      a cellplate line common across said array of memory cells, and
      an apparatus for sensing a logic state of one of said memory cells, said apparatus comprising:
         first and second sensing lines between which are connected a memory element having at least two resistive memory states;
         switching circuitry that provides sensing current through the memory element; and
         output circuitry that receives said sensing current and, in response, provides an output signal indicating a resistance state of said memory element.

9. An integrated circuit comprising:
   a memory device, said memory device comprising:
      an array of memory cells,
      a cellplate line common across said array of memory cells, and
      an apparatus for sensing a logic state of one of said memory cells, said apparatus comprising:
         first and second sensing lines between which are connected a memory element having at least two resistive memory states;
         switching circuitry that provides sensing current through the memory element; and
         output circuitry that receives said sensing current and, in response, provides an output signal indicating a resistance state of said memory element.

10. A processing system, comprising:
    a processor; and
    a memory device coupled to said processor via a bus, said memory device comprising:
       an array of memory cells,
       a cellplate line common across said array of memory cells, and
       a control circuit providing a control signal, said control signal controlling when said memory cell is sensed;
       a switching circuit that receives a celiplate count signal and a bit count signal provided by said control circuit, said switching circuit further receiving a ceilpiate line signal and a bit line signal from said memory cell, said switching circuit producing a first output signal and a second output signal; and
       a comparison circuit receiving said first and second output signals and outputting a signal corresponding to the logic state of said memory cell.

* * * * *

UNITED STATES PATENT AND TRADEMARK OFFICE
CERTIFICATE OF CORRECTION

PATENT NO. : 7,263,017 B2 Page 1 of 1
APPLICATION NO. : 11/481957
DATED : August 28, 2007
INVENTOR(S) : Voshell It is certified that error appears in the above-identified patent and that said Letters Patent is hereby corrected as shown below:

In column 6, line 42, in Claim 3, delete "celiplate" and insert -- cellplate --, therefor.

In column 6, line 43, in Claim 3, delete "celiplate" and insert -- cellplate --, therefor.

In column 7, line 8, in Claim 6, delete "celiplate" and insert -- cellplate --, therefor.

In column 7, line 9, in Claim 6, delete "celiplate" and insert -- cellplate --, therefor.

In column 7, line 14, in Claim 6, delete "celiplate" and insert -- cellplate --, therefor.

In column 7, line 29, in Claim 7, delete "conlprising:" and insert -- comprising: --, therefor.

In column 8, line 31, in Claim 10, after "cells, and" insert -- an apparatus for sensing a logic state of a memory cell, comprising: --.

In column 8, line 35, in Claim 10, delete "celiplate" and insert -- cellplate --, therefor.

In column 8, line 38, in Claim 10, delete "ceilpiate" and insert -- cellplate --, therefor.

Signed and Sealed this

Thirteenth Day of November, 2007

JON W. DUDAS
*Director of the United States Patent and Trademark Office*